US008766202B2

(12) United States Patent  
Kim et al.

(10) Patent No.: US 8,766,202 B2
(45) Date of Patent: Jul. 1, 2014

(54) X-RAY DETECTORS INCLUDING DIFFUSION BARRIER FILMS

(75) Inventors: Sun-il Kim, Osan-si (KR); Jae-chul Park, Suwon-si (KR); Chang-jung Kim, Yongin-si (KR); Sang-wook Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 159 days.

(21) Appl. No.: 13/247,512

(22) Filed: Sep. 28, 2011

(65) Prior Publication Data

US 2012/0211663 A1  Aug. 23, 2012

(30) Foreign Application Priority Data

Feb. 18, 2011  (KR) ........................ 10-2011-0014649

(51) Int. Cl.
  *G01T 1/24* (2006.01)
  *H04N 5/32* (2006.01)
(52) U.S. Cl.
  USPC ................................ 250/370.09; 250/370.14
(58) Field of Classification Search
  USPC ........................ 250/370.08–370.13
  See application file for complete search history.

(56) References Cited

U.S. PATENT DOCUMENTS

| 4,236,829 | A | 12/1980 | Chikamura et al. |
| 5,737,050 | A | 4/1998 | Takahara et al. |
| 6,025,599 | A | 2/2000 | Lee et al. |
| 7,186,985 | B2 | 3/2007 | Iwanczyk et al. |
| 7,323,692 | B2 | 1/2008 | Rowlands et al. |
| 7,405,408 | B2 | 7/2008 | Vogtmeier et al. |
| 7,435,968 | B2 * | 10/2008 | Watanabe et al. ........ 250/370.14 |
| 7,576,327 | B2 | 8/2009 | Okada |
| 7,589,324 | B2 * | 9/2009 | Chen et al. ............... 250/370.08 |
| 7,709,804 | B2 | 5/2010 | Sakamoto et al. |
| 7,834,324 | B2 | 11/2010 | Imai |
| 7,872,237 | B2 * | 1/2011 | Puhakka et al. ......... 250/370.08 |
| 8,497,483 | B2 * | 7/2013 | Puhakka et al. ......... 250/370.08 |
| 2001/0008271 | A1 | 7/2001 | Ikeda et al. |
| 2002/0145116 | A1 | 10/2002 | Choo et al. |
| 2003/0021382 | A1 | 1/2003 | Iwanczyk et al. |
| 2004/0127038 | A1 | 7/2004 | Carcia et al. |
| 2004/0178426 | A1 | 9/2004 | Melekhov et al. |

(Continued)

FOREIGN PATENT DOCUMENTS

| EP | 1120833 A2 | 8/2001 |
| EP | 1978563 A2 | 10/2008 |

(Continued)

OTHER PUBLICATIONS

U.S. Office Action dated Sep. 24, 2013 issued in U.S. Appl. No. 12/923,553.

(Continued)

*Primary Examiner* — Casey Bryant
(74) *Attorney, Agent, or Firm* — Harness, Dickey & Pierce, P.L.C.

(57) ABSTRACT

An X-ray detector includes a photoconductor, a first diffusion barrier film on a first surface of the photoconductor, at least one pixel electrode on the first diffusion barrier film, a signal transmitting unit to process an electrical signal output from the at least one pixel electrode, and a common electrode on a second surface of the photoconductor opposite to the first surface of the photoconductor.

38 Claims, 4 Drawing Sheets

(56) References Cited

U.S. PATENT DOCUMENTS

| | | | |
|---|---|---|---|
| 2004/0256569 | A1 | 12/2004 | Tokuda |
| 2005/0178970 | A1* | 8/2005 | Amemiya et al. ....... 250/370.09 |
| 2005/0184320 | A1 | 8/2005 | Green et al. |
| 2006/0054835 | A1 | 3/2006 | Rowlands et al. |
| 2006/0158095 | A1 | 7/2006 | Imamura |
| 2006/0192087 | A1 | 8/2006 | Kuszpet et al. |
| 2007/0114430 | A1 | 5/2007 | Imai et al. |
| 2008/0087835 | A1 | 4/2008 | Okada |
| 2009/0026379 | A1 | 1/2009 | Yaegashi et al. |
| 2009/0026382 | A1* | 1/2009 | Sakamoto et al. ....... 250/370.09 |
| 2009/0110144 | A1 | 4/2009 | Takahashi et al. |
| 2009/0152664 | A1 | 6/2009 | Klem et al. |
| 2011/0049375 | A1* | 3/2011 | Kameshima et al. .... 250/370.08 |
| 2011/0156273 | A1* | 6/2011 | Puhakka et al. ............. 257/774 |
| 2011/0240869 | A1 | 10/2011 | Kim et al. |
| 2011/0309259 | A1* | 12/2011 | Kim et al. ................ 250/370.09 |
| 2012/0146016 | A1* | 6/2012 | Park et al. ........................ 257/42 |
| 2012/0181440 | A1* | 7/2012 | Kim et al. ................ 250/370.01 |
| 2012/0223241 | A1* | 9/2012 | Kim et al. ................ 250/370.09 |

FOREIGN PATENT DOCUMENTS

| | | |
|---|---|---|
| JP | 01-114782 A | 5/1989 |
| JP | 08-289886 | 11/1996 |
| JP | 2005-183454 | 7/2005 |
| JP | 2006049773 A | 2/2006 |
| JP | 2007-324470 | 12/2007 |
| JP | 2009-031159 | 2/2009 |
| JP | 2009-032854 | 2/2009 |
| JP | 2009-131564 | 6/2009 |
| KR | 100767384 | 10/2007 |
| KR | 20080105518 A | 12/2008 |
| KR | 20090131773 A | 12/2009 |
| KR | 20100044451 A | 4/2010 |
| WO | WO-2004/038810 A2 | 5/2004 |

OTHER PUBLICATIONS

U.S. Office Action dated Dec. 10, 2013 issued in U.S. Appl. No. 12/926,921.

U.S. Advisory Action dated Oct. 31, 2013 issued in U.S. Appl. No. 12/926,921.

U.S. Office Action dated Jun. 24, 2013 issued in U.S. Appl. No. 12/926,921.

U.S. Office Action dated Jan. 29, 2013 issued in U.S. Appl. No. 12/926,921.

Extended European Search Report dated Feb. 7, 2014, issued in Application No. 11192248.0.

* cited by examiner

X-RAY DETECTORS INCLUDING DIFFUSION BARRIER FILMS

CROSS-REFERENCE TO RELATED APPLICATION(S)

This application claims priority under 35 U.S.C. §119 to Korean Patent Application No. 10-2011-0014649, filed on Feb. 18, 2011, in the Korean Intellectual Property Office, the disclosure of which is incorporated herein in its entirety by reference.

BACKGROUND

1. Field

Example embodiments relate to X-ray detectors including diffusion barrier films to suppress and/or prevent a reaction between a photoconductor and a pixel electrode.

2. Description of the Related Art

X-ray detectors including thin film transistors (TFTs) are used for medical diagnosis. Conventional X-ray detectors output a digital signal in the form of an X-ray image or an X-ray fluoroscopy image. Such X-ray detectors operate via a direct method or an indirect method.

A conventional direct method X-ray detector includes a photoconductor that generates electron-hole pairs in response to irradiated X-radiation, and pixel electrodes that receive electric charges from the photoconductor. The X-radiation is directly converted into electric charges by the photoconductor.

A conventional indirect method X-ray detector converts X-radiation into a visible ray using a scintillator, and converts the visible ray into electric charges using a photoelectric transformation element such as a photodiode.

Mercury(II) iodide ($HgI_2$) is a material used to form the above-mentioned photoconductor. Because $HgI_2$ has a relatively high atomic weight, $HgI_2$ having a relatively low thickness absorbs X-radiation relatively easily. $HgI_2$ also has a relatively low ionization energy in response to X-radiation, and thus, $HgI_2$ has been considered as an appropriate material for the photoconductor. However, $HgI_2$ has a relatively high reactivity with most metals, and thus, corrodes most metals.

If pixel electrodes are formed of a metal with a relatively low resistance, the Hg of $HgI_2$ diffuses into the photoconductor over time because of the relatively high reactivity between Hg and the metal. This results in deterioration and/or degradation of photoconductor properties.

SUMMARY

Example embodiments provide X-ray detectors including diffusion barrier films disposed between a photoconductor and a pixel electrode.

Additional aspects will be set forth in part in the description which follows and, in part, will be apparent from the description, or may be learned by practice of the presented embodiments.

At least one example embodiment provides an X-ray detector. The X-ray detector includes: a photoconductor; a first diffusion barrier film on a first surface of the photoconductor; at least one pixel electrode on the first diffusion barrier film; a signal transmitting unit to process an electrical signal output from the at least one pixel electrode; and a common electrode on a second surface of the photoconductor. The second surface is opposite to the first surface.

According to at least some example embodiments, the signal transmitting unit may include: a transistor and a signal storage capacitor disposed in series on a substrate. An insulating layer may be formed between the at least one pixel electrode and the transistor, and between the at least one pixel electrode and the signal storage capacitor. The at least one pixel electrode may be connected to a source electrode of the transistor and an upper electrode of the signal storage capacitor by a contact plug formed through the insulating layer.

A signal processor may be connected to a drain electrode of the transistor. The signal processor may be configured to generate an image based on processed signals from the signal transmitting unit.

According to at least some example embodiments, the X-ray detector may further include a plurality of pixel electrodes. The signal transmitting unit may further include: at least one application specific integrated circuit electrically connected to a printed circuit board; a polymer planarization film on the printed circuit board; and contact plugs formed through the polymer planarization film. The contact plugs electrically connect the plurality of pixel electrodes with contacts of the at least one application specific integrated circuit.

The contact plugs and the plurality pixel electrodes may be electrically connected by a plurality of connection wires.

The polymer planarization film may include a plurality of planarization films formed on the at least one application specific integrated circuit. The contact plugs may be formed through each of the plurality of planarization films. A plurality of connection wires may be formed between adjacent ones of the plurality of planarization films, and may connect contact plugs formed in the adjacent planarization films.

According to at least some example embodiments, the X-ray detector may include a plurality of pixel electrodes. The signal transmitting unit may include: at least one application specific integrated circuit electrically connected to a printed circuit board; an insulating layer and a substrate sequentially stacked on the at least one application specific integrated circuit; and contact plugs formed through the substrate and the insulating layer. The contact plugs may connect the plurality of pixel electrodes with contacts of the at least one application specific integrated circuit.

The X-ray detector may further include a plurality of application specific integrated circuits. The plurality of pixel electrodes may be divided into a plurality of groups, and each group of pixel electrodes may correspond to one of the plurality of application specific integrated circuits.

The plurality of pixel electrodes may be formed of one of copper (Cu), aluminum (Al), and an alloy thereof.

The first diffusion barrier film may be formed of an oxide semiconductor (e.g., a conductive oxide semiconductor). For example, the first diffusion barrier film may be formed of an oxide semiconductor (e.g., a zinc-oxide (ZnO) based oxide semiconductor) including ZnO and at least one of gallium (Ga), indium (In), hafnium (Hf), and tin (Sn). The oxide semiconductor may have a resistance between about 1 $\mu\Omega \cdot cm$ and about 100 $M\Omega \cdot cm$, inclusive. The first diffusion barrier film may have a thickness between about 0.1 $\mu m$ and about 100 $\mu m$, inclusive. In another example, the first diffusion barrier film may have a thickness of about 3000 Å.

The photoconductor may include at least one of mercury (II) iodide ($HgI_2$), lead(II) iodide ($PbI_2$), cadmium telluride (CdTe), cadmium zinc telluride (CdZnTe), and lead(II) oxide (PbO). The photoconductor may have a thickness of between about 100 $\mu m$ and about 800 $\mu m$, inclusive.

According to at least some example embodiments, the X-ray detector may further include a second diffusion barrier film disposed between the common electrode and the photoconductor. The second diffusion barrier film may be formed of an oxide semiconductor (e.g., a conductive oxide semiconductor). For example, the second diffusion barrier film may be formed of a ZnO based oxide semiconductor including ZnO and at least one of Ga, In, Hf, and Sn. The second diffusion barrier film may have a thickness between about 100 Å and about 1000 Å, inclusive. In one example, the first and second barrier diffusion films may be formed of the same or substantially the same material.

According to at least some example embodiments, the signal transmitting unit may include: transistor and a storage capacitor disposed in series on a substrate. The photoconductor may be configured to generate charges in response to X-radiation passing through the common electrode. The storage capacitor may be configured to store the generated charges in response to a voltage applied to the pixel electrode. The transistor may be configured to transfer the charges to a signal processor.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
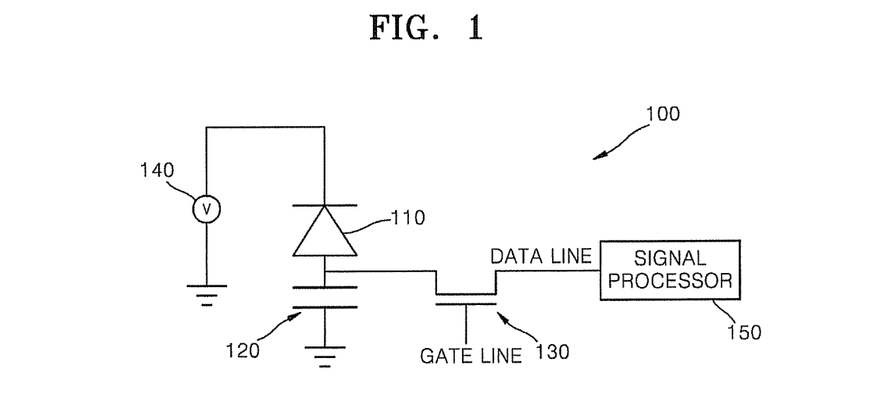
FIG. 1 is an equivalent circuit diagram of an X-ray detector including a diffusion barrier film according to an example embodiment.

FIG. 1 is an equivalent circuit diagram of an X-ray detector 100 including a diffusion barrier film according to an example embodiment. The X-ray detector 100 includes an array of pixels. FIG. 1 is an equivalent circuit diagram of one of the pixels. Only a single pixel is shown in FIG. 1 for the sake of clarity.

Referring to FIG. 1, each pixel of the X-ray detector 100 includes a signal storage capacitor 120 and a switching transistor 130 disposed in series on a substrate. The signal storage capacitor 120 and the switching transistor 130 are connected in parallel with a photoconductor 110. A voltage supply source 140 applies a direct current voltage that creates an electric field in the photoconductor 110. The switching transistor 130 is turned on through a gate line, and charges stored in the signal storage capacitor 120 are transferred to a signal processor 150 through a data line.

Figure 2:
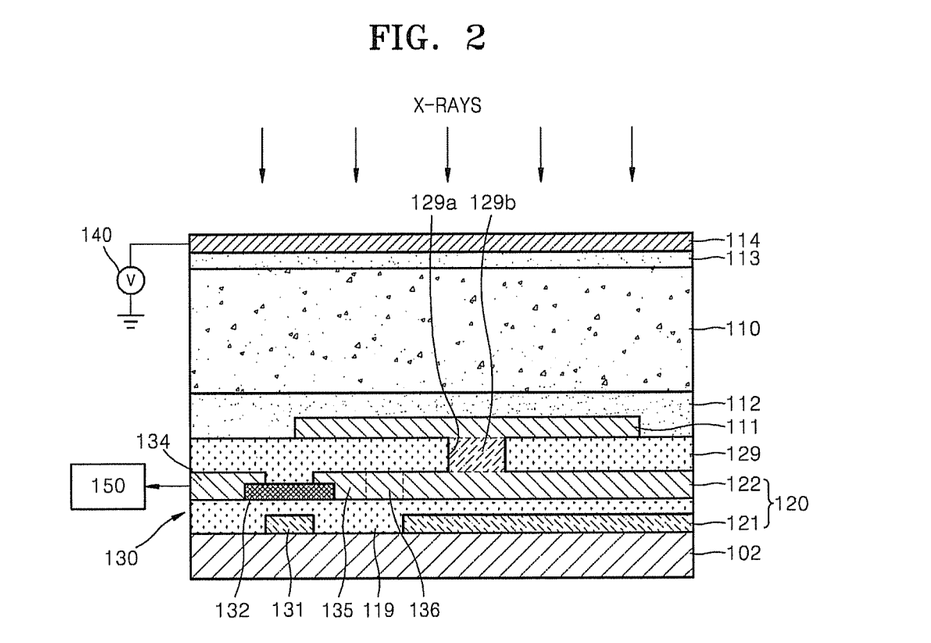
FIG. 2 is a cross-sectional view illustrating a structure of the X-ray detector of FIG. 1 according to an example embodiment.

FIG. 2 is a cross-sectional view illustrating a structure of the X-ray detector 100 of FIG. 1 according to an example embodiment. The same elements as those in FIG. 1 are denoted by the same reference numerals and a detailed explanation thereof will not be given.

Referring to FIG. 2, the signal storage capacitor 120 and the switching transistor 130 are connected in series on a substrate 102. The photoconductor 110 is disposed above or over the signal storage capacitor 120 and the switching transistor 130.

The substrate 102 may be formed of glass, silicon, plastic, or the like. A gate 131 of the switching transistor 130 and a lower electrode 121 of the signal storage capacitor 120 are disposed on the substrate 102. The gate 131 and the lower electrode 121 may be formed of the same or substantially the same metal, metallic and/or conductive material. The gate line (see FIG. 1), which is not shown in FIG. 2 for convenience, is connected to the gate 131.

A first insulating layer 119 is formed on the substrate 102 to cover the gate 131 and the lower electrode 121. The first insulating layer 119 may be formed of silicon nitride, silicon oxide, silicon oxynitride, alumina, hafnium oxide, or the like. The portion of the first insulating layer 119 on the gate 131 acts as a gate insulator (e.g., a gate oxide), and the portion of the first insulating layer 119 on the lower electrode 121 acts as a capacitor dielectric. The gate insulator and the capacitor dielectric may be formed of different materials, and in this case, a process of forming thin films for the corresponding insulating layer and an etching processing of the thin films may be additionally required.

A channel 132 is formed on the first insulating layer 119 above the gate 131. The channel 132 may be formed of amorphous silicon, polysilicon, zinc-oxide (ZnO), tin-oxide ($SnO_2$), a ZnO-based semiconductor, a $SnO_2$-based semiconductor, or the like. The ZnO-based semiconductor may include, for example, ZnO and at least one of gallium (Ga), indium (In), hafnium (Hf), tin (Sn), and the like. The $SnO_2$-based semiconductor may include, for example, $SnO_2$ and at least one of gallium (Ga), indium (In), hafnium (Hf), aluminum (Al), and the like. More particular examples of ZnO-based semiconductors include: indium-zinc-oxide (InZnO), gallium-indium-zinc-oxide (GaInZnO), hafnium-indium-zinc-oxide (HfInZnO), tin-zinc-oxide (SnZnO), and tin-indium-zinc-oxide (SnInZnO). More specific examples of $SnO_2$-based semiconductors include: indium-tin-oxide (In$SnO_2$), gallium-tin-oxide (Ga$SnO_2$), and hafnium-tin-oxide (Hf$SnO_2$).

A metal layer is formed on the first insulating layer 119 to cover the ends of the channel 132. The metal layer covering both ends of the channel 132 includes a drain electrode 134, a source electrode 135, an upper electrode 122 of the signal storage capacitor 120, and a connection wire 136 extending between the source electrode 135 and the upper electrode 122. Thus, the upper electrode 122 is connected to the source electrode 135 by the connection wire 136.

The upper electrode 122 is formed to correspond to the lower electrode 121, and the upper electrode 122, the lower electrode 121, and the portion of the first insulating layer 119 between the upper electrode 122 and the lower electrode 121 constitute the signal storage capacitor 120.

The drain electrode 134 is connected to the signal processor 150 through the data line (see FIG. 1). The signal processor 150 quantifies charges from the data line of each pixel to generate an image.

A second insulating layer 129 is formed on the upper electrode 122, the drain electrode 134, the source electrode 135 and an exposed portion of the channel 132. In this example, the second insulating layer 129 is a passivation layer. The second insulating layer 129 and the first insulating layer 119 may be formed of the same material, substantially the same material or different materials.

A contact (or via) hole 129a is formed through the second insulating layer 129 to expose a portion of the upper surface of the upper electrode 122. A conductive contact plug 129b fills the via-hole 129a. The contact plug 129b may be formed of aluminum (Al), molybdenum (Mo), an alloy thereof, or the like.

A pixel electrode 111, a first diffusion barrier film 112, the photoconductor 110, and a common electrode 114 are sequentially formed on the second insulating layer 129.

The pixel electrode 111 may be formed of a relatively inexpensive metal with desired (e.g., excellent) electrical characteristics. For example, the pixel electrode 111 may be formed of copper (Cu), aluminum (Al), an alloy thereof, or the like.

The photoconductor 110 may be formed of, for example, at least one of mercury(II) iodide ($HgI_2$), lead(II) iodide ($PbI_2$), cadmium telluride (CdTe), cadmium zinc telluride (CdZnTe), and lead(II) oxide (PbO).

Conventionally, because a photoconductor has a relatively high reactivity with conventional pixel electrode materials, an element of the photoconductor material may diffuse into the pixel electrode, thereby causing deterioration of photoconductive properties of the photoconductor. However, the example embodiment shown in FIG. 2 includes a first diffusion barrier film 112 formed on the second insulating layer 129 to cover the pixel electrode 111. The first diffusion barrier film 112 suppresses and/or prevents reaction between the pixel electrode 111 and the photoconductor 110.

According to at least some example embodiments, the first diffusion barrier film 112 may be formed of an oxide semiconductor (e.g., a conductive oxide semiconductor). The oxide semiconductor may be a zinc-oxide (ZnO) based semiconductor including, for example, ZnO and at least one of Ga, In, Hf, Sn, and the like. More particular examples of ZnO-based semiconductors include: InZnO, GaInZnO, HfInZnO, SnZnO, and SnInZnO. The oxide semiconductor may have a resistance between about 1 μΩ·cm and about 100 MΩ·cm, inclusive.

If a resistance of the oxide semiconductor is less than about 1 μΩ·cm, then charges formed in a photoconductor in one pixel may move to another pixel along the oxide semiconductor. As a result, the X-ray detector may not obtain an accurate image. If a resistance of an oxide semiconductor is greater than or equal to about 100 MΩ·cm, then charges formed in a photoconductor may be blocked, thereby reducing sensitivity of the X-ray detector.

The first diffusion barrier film 112 may be formed to have a thickness between about 0.1 μm to about 100 μm, inclusive.

If the thickness of the first diffusion barrier film 112 is less than about 0.1 μm, dark current may increase, thereby deteriorating properties of the first diffusion barrier film 112. If the thickness of the first diffusion barrier film 112 is greater than about 100 μm, a total series resistance may increase, and thus, a voltage applied to the photoconductor 110 may decrease, thereby reducing the sensitivity of the photoconductor 110.

Still referring to FIG. 2, the voltage supply source 140 applies a direct current voltage to the common electrode 114. A positive voltage or a negative voltage may be applied to the common electrode 114 according to the photoconductor 110. For example, if charges transferred to the photoconductor 110 and stored in the signal storage capacitor 120 are holes, then a positive voltage is applied to the pixel electrode 111. If charges transferred to the photoconductor 110 and stored in the signal storage capacitor 120 are electrons, then a negative voltage is applied to the pixel electrode 111.

The photoconductor 110 and the common electrode 114 may have flat (or substantially flat) plate shapes and be formed to cover a plurality of pixels. Each pixel electrode 111 corresponds to one pixel. A switching transistor 130 and a signal storage capacitor 120 also correspond to each pixel.

According to at least some example embodiments, the X-ray detector 100 includes a plurality of pixels arranged in an array. FIGS. 1 and 2 are an equivalent circuit diagram and a cross-sectional view corresponding to each pixel, respectively.

Still referring to FIG. 2, a second diffusion barrier film 113 is formed between the photoconductor 110 and the common electrode 114. The common electrode 114 may be formed of indium-tin-oxide (ITO), copper (Cu), aluminum (Al), or the like. If the common electrode 114 is formed of copper (Cu) or aluminum (Al), then the second diffusion barrier film 113 may be formed of the same or substantially the same material as the first diffusion barrier film 112. The second diffusion barrier film 113 may be formed to have a thickness between about 100 Å and about 1000 Å, inclusive.

If the thickness of the second diffusion barrier film 113 is less than about 100 Å, dark current may increase, thereby causing the second diffusion barrier film 113 to malfunction. If the thickness of the second diffusion barrier film 113 is greater than about 1000 Å, then a total series resistance may increase. As a result, a voltage applied to the photoconductor 110 may decrease, and the sensitivity of the photoconductor 110 may also decrease.

A direct current voltage applied to the common electrode 114 may vary according to the material and/or thickness of the photoconductor 110. Also, the thickness of the photoconductor 110 may vary according to the object and/or portion of the object to be imaged. For example, if the photoconductor 110 is formed of $HgI_2$ and a patient's chest is to be imaged, then the thickness of the photoconductor 110 may be between about 300 µm and about 800 µm, inclusive. In another example, if the photoconductor 110 is formed of $HgI_2$ and a patient's breast is to be imaged, then the thickness of the photoconductor 110 may be between about 100 µm and about 300 µm, inclusive. If the photoconductor 110 is formed of $HgI_2$, then a voltage of about 0.5 V/µm may be applied to the common electrode 114.

According to at least one example embodiment, the switching transistor 130, the signal storage capacitor 120 and the contact plug 129b may constitute a signal transmitting unit. The signal processor 150 may also be part of the signal transmitting unit.

Example operation of the X-ray detector 100 will now be explained with reference to FIGS. 1 and 2.

X-radiation (X-rays) passing through the common electrode 114 and the second diffusion barrier film 113 is absorbed by the photoconductor 110, and electron-hole pairs are generated in the photoconductor 110. The number of the electron-hole pairs depends on energy of the X-radiation absorbed by the photoconductor 110. When a first direct current voltage is applied to the pixel electrode 111, the electron-hole pairs are separated into electrons and holes. If the photoconductor 110 is formed of $HgI_2$, the holes flow to the pixel electrode 111 and are accumulated in the signal storage capacitor 120.

When the switching transistor 130 is turned on, charges (holes) stored in the signal storage capacitor 120 are transferred to the signal processor 150 through the drain electrode 134.

The signal processor 150 generates an image by measuring X-ray transmittance through the object being images based on the number of transferred charges in each pixel.

Figure 3:
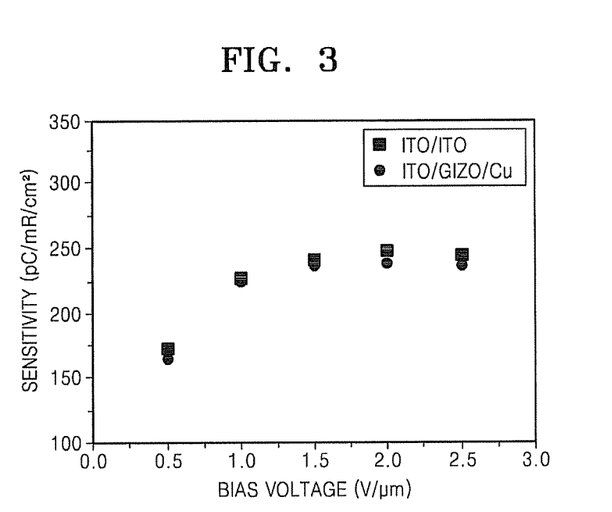
FIGS. 3 and 4 are graphs illustrating example electrical characteristics of a conventional X-ray detector and an X-ray detector according to an example embodiment.
Figure 4:
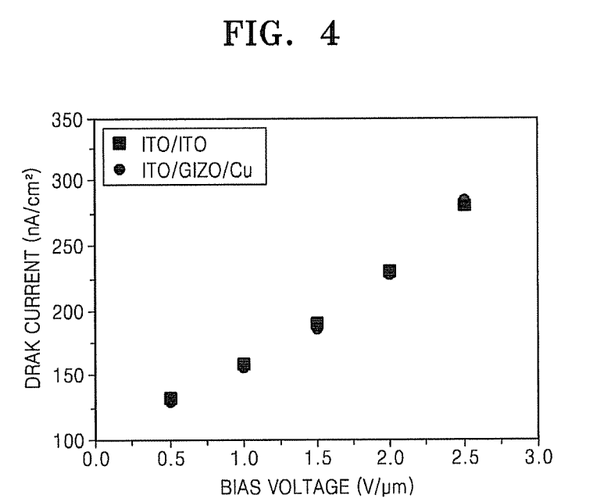

FIGS. 3 and 4 are graphs illustrating example electrical characteristics of a conventional X-ray detector and an X-ray detector according to an example embodiment. FIG. 3 illustrates sensitivities, and FIG. 4 illustrates dark currents.

The conventional X-ray detector includes a common electrode formed of ITO, a photoconductor formed of $HgI_2$, and a pixel electrode formed of ITO. The X-ray detector according to an example embodiment includes a common electrode formed of ITO, a photoconductor formed of $HgI_2$, a first diffusion barrier film formed of GaInZnO, and a pixel electrode formed of copper (Cu).

A thickness of each of the photoconductors of the conventional X-ray detector and the X-ray detector according to an example embodiment ranges from between about 100 µm and about 120 µm, inclusive. The first diffusion barrier film formed of GaInZnO (referred to as GIZO hereinafter) has a thickness of about 3000 Å and a resistance between about 500 µΩ·cm to about 800 µΩ·cm, inclusive.

The conventional X-ray detector using the photoconductor formed of $HgI_2$ and the pixel electrode formed of ITO has desirable (e.g., excellent) sensitivity and dark current characteristics. But, when the pixel electrode is formed of Cu without a diffusion barrier layer, a reaction may occur between $HgI_2$ and Cu, thereby damaging the pixel electrode and reducing the sensitivity and dark current characteristics of the X-ray detector. When the first diffusion barrier film formed of GaInZnO is formed between $HgI_2$ photoconductor and the Cu pixel electrode as in at least some example embodiments, damage to the pixel electrode is suppressed and/or prevented.

As shown in FIG. 3, the X-ray power is about 30 kV. A sensitivity, which refers to the ability to detect charges according to applied voltages, between the conventional X-ray detector and the X-ray detector according to an example embodiment is similar. The X-ray detector using the first diffusion barrier film formed of GIZO and the pixel electrode formed of Cu has substantially the same sensitivity and substantially no deterioration of the photoconductor relative to the conventional X-ray detector.

Referring to FIG. 4, the dark current characteristics according to applied voltages of the conventional X-ray detector and the X-ray detector according to the example shown in FIGS. 1 and 2 are similar. The X-ray detector using the first diffusion, barrier film formed of GIZO and the pixel electrode formed of Cu has substantially similar dark current and photoconductive characteristics relative to the conventional X-ray detector using the pixel electrode formed of ITO.

Figure 5:
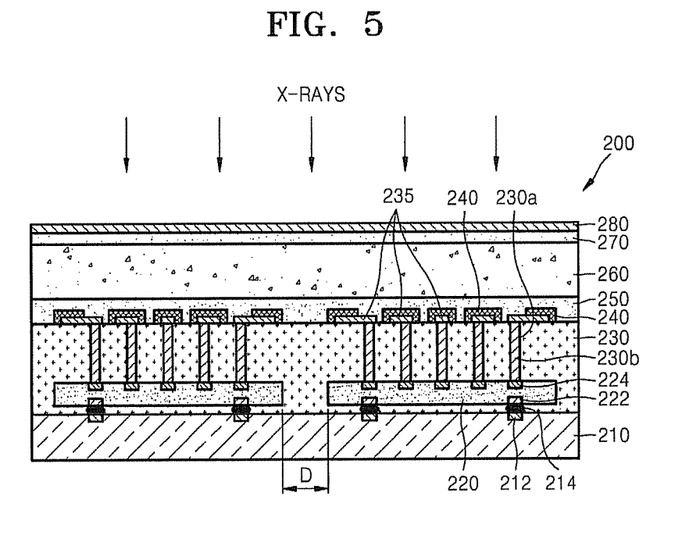
FIG. 5 is a cross-sectional view of an X-ray detector including a diffusion barrier film according to another example embodiment.

FIG. 5 is a cross-sectional view of an X-ray detector 200 according to another example embodiment.

Referring to FIG. 5, the X-ray detector 200 includes an array of application specific integrated circuits (ASICs) 220 tiled on a printed circuit board 210. A plurality of contacts 222 are formed on lower portions of each of the ASICs 220. Contacts 212 are formed on the printed circuit board 210 to correspond to the contacts 222. The ASICs 220 are electrically connected to the printed circuit board 210 through bumps 214.

In one example, the ASICs 220 may be formed of single crystalline silicon. Each ASIC 220 may be obtained by forming a circuit on single crystalline silicon. The ASICs 220 may have a relatively high operating speed and/or relatively low noise. Also, the ASICs 220 may increase a speed at which an electrical signal from a photoconductor 260 is processed, and transmit the processed electrical signal to the printed circuit board 210.

Due to limitations of masks used in semiconductor processes, the ASICs 220 may be manufactured to have a maximum size of about 2 cm×2 cm. About several ten thousands to several hundred thousands of pixel regions may be formed in each of the ASICs 220. The ASICs 220 are separated from one another by a distance D (also referred to as a seam region).

The printed circuit board 210 quantifies an X-ray transmittance through an object to be imaged based on the electrical signal input from the ASICs 220 to form an image signal. The ASICs 220 process electrical signals output from pixel electrodes 240 at relatively high speeds, and provide necessary information to the printed circuit board 210, to reduce a signal processing time in the printed circuit board 210.

A planarization film 230 is formed on the printed circuit board 210 to cover the ASICs 220. The planarization film 230 may be formed of polymer, for example, a SU-8 photoresist, polyimide, or the like. The planarization film 230 is formed to have a thickness between about 200 µm and about 500 µm, inclusive. Via-holes 230a are formed through the planarization film 230 to exposed contacts 224 of the ASICs 220. Contact plugs 230b are filled in the via-holes 230a. The contact plugs 230b may be formed of aluminum (Al), copper (Cu), and alloy thereof, or the like.

The plurality of pixel electrodes 240 are formed on the planarization film 230. The pixel electrodes 240 are disposed on the planarization film 230 at regular or substantially regular intervals. Horizontal wires 235 are disposed between the pixel electrodes 240 and the contact plugs 230b to electrically connect the pixel electrodes 240 and the contact plugs 230b. Also, as will be described later, the pixel electrodes 240 are distributed uniformly or substantially uniformly on the planarization film 230.

The plurality of pixel electrodes 240 are divided into a plurality of groups, and each group of pixel electrodes 240 is connected to a corresponding (corresponds to) an ASIC 220.

A first diffusion barrier film 250 is formed on the planarization film 230 to cover the horizontal wires 235 and the pixel electrodes 240. A photoconductor 260, a second diffusion barrier film 270, and a common electrode 280 are formed sequentially on the first diffusion barrier film 250.

The first diffusion barrier film 250 suppresses and/or prevents reaction between the pixel electrodes 240 and the photoconductor 260. The first diffusion barrier film 250 may be formed of an oxide semiconductor (e.g., a conductive oxide semiconductor). The conductive oxide semiconductor may be a ZnO-based semiconductor including, for example, ZnO and at least one of Ga, In, Hf, Sn, and the like. More particular examples of ZnO-based semiconductors include InZnO, GaInZnO, HfInZnO, SnZnO, and SnInZnO. The first diffusion barrier film 250 may be formed to have a thickness between about 0.1 μm and about 100 μm, inclusive.

The photoconductor 260 may be formed of a single material layer. For example, the photoconductor 260 may be formed of a material including one of $HgI_2$, $PbI_2$, CdTe, CdZnTe, PbO, and any mixtures thereof.

The photoconductor 260 generates charges according to the strength of incident X-radiation (X-rays). The photoconductor 260 may be divided into a plurality of seamless pixel regions. The pixel electrodes 240 are formed under the pixel regions, and charges are gathered in the corresponding pixel regions to be converted into an electrical signal. The electrical signals are transmitted to the corresponding contact 224 of the ASICs 220.

Still referring to FIG. 5, the second diffusion barrier film 270 is formed on the photoconductor 260, and the common electrode 280 is formed on the second diffusion barrier film 270. The common electrode 280 may have a flat or substantially flat plate shape and be formed of ITO, copper, aluminum, an alloy thereof, or the like. If the common electrode 280 is formed of copper or aluminum, then the second diffusion barrier film 270 may be formed of the same or substantially the same material as the first diffusion barrier film 250.

The second diffusion barrier film 270 may be formed to have a thickness between about 100 Å and about 1000 Å, inclusive. If the thickness of the second diffusion barrier film 270 is less than about 100 Å, then dark current may increase, thereby causing the diffusion block properties of the second diffusion barrier film 270 to deteriorate. If the thickness of the second diffusion barrier film 270 is greater than about 1000 Å, then a total series resistance may increase, and an applied voltage to the photoconductor 260 may decrease, thereby reducing the sensitivity of the photoconductor 260.

The pixel electrodes 240 are connected to the contacts 224 of the ASICs 220 through the horizontal wires 235 and the contact plugs 230b. The horizontal wires 235 will be discussed in more detail later with reference to FIG. 6. The horizontal wires 235 are also referred to herein as connection Wires.

In the example embodiment shown in FIG. 5, the ASICs 220, and the contact plugs 230b formed through the planarization film 230 constitute a signal transmitting unit.

Figure 6:
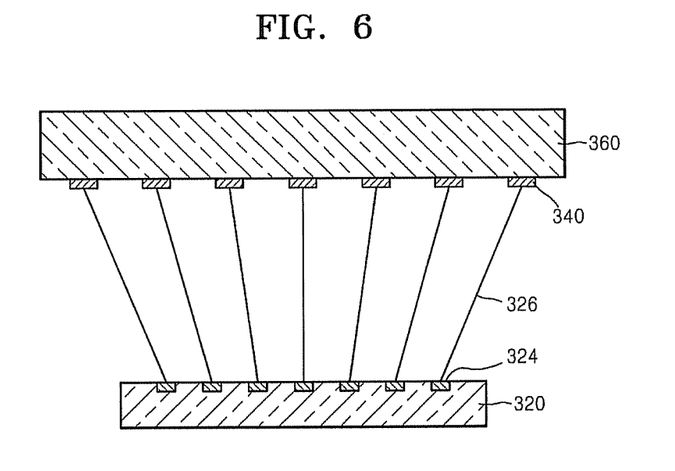
FIG. 6 is a conceptual view for explaining an electrical connection between pixel electrodes and an application specific integrated circuit in the X-ray detector of FIG. 5.

FIG. 6 is a conceptual view for explaining an electrical connection between pixel electrodes and ASICs in an example embodiment of the X-ray detector 200 of FIG. 5.

Referring to FIG. 6, because the ASICs 320 are tiled, the ASICs 320 are spaced apart by the distance D (seam region, see FIG. 5). Moreover, a photoconductor 360 uses an entire X-ray incident area, and thus, an area of the photoconductor 360 is greater than a surface area of the ASICs 320. Accordingly, inclined (or slanted) connection wires 326 may be used in order to connect the pixel electrodes 340 with contacts 324 of the ASICs 320 as shown in FIG. 6. However, forming inclined connection wires 326 is relatively difficult.

In the example embodiment shown in FIG. 5, the pixel electrodes 340 and the contact plugs 230b (see FIG. 5) formed vertically relative to the contacts 324 of the ASICs 320 are connected by the horizontal wires 235 (see FIG. 5). Although the horizontal wires 235 are disposed under the pixel electrodes 240 in FIG. 5, the horizontal wires 235 may actually be wires bypassing adjacent contact plugs 230b.

In the X-ray detector 200 of FIG. 5, an image of an image pickup region may be reproduced more clearly because the ASICs 220 and the pixel electrodes 240 are electrically connected through the planarization film 230 relatively easily and charges detected from the photoconductor corresponding to a seam region of the ASICs 220 are transferred to the ASICs 220.

Figure 7:
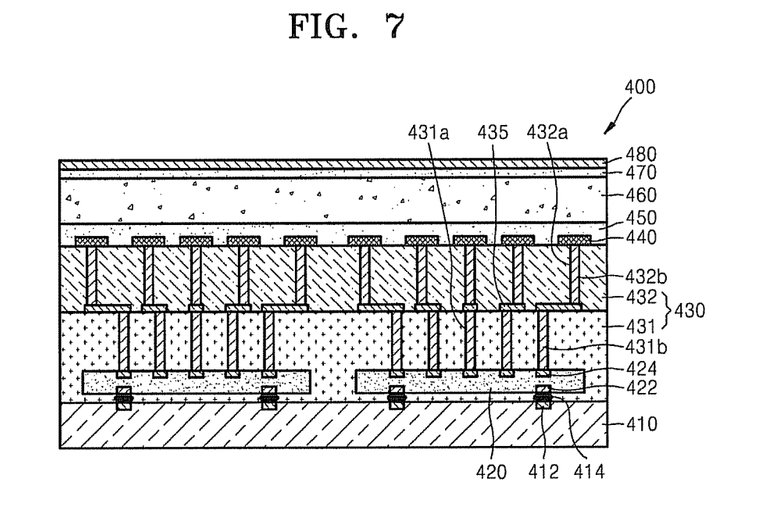
FIG. 7 is a cross-sectional view of an X-ray detector including a diffusion barrier film according to yet another example embodiment.

FIG. 7 is a cross-sectional view of an X-ray detector 400 according to another example embodiment.

Referring to FIG. 7, the X-ray detector 400 includes an array of ASICs 420 tiled on a printed circuit board 410. A plurality of contacts 422 are formed on lower surfaces of the ASICs 420. The contacts 422 of the ASICs 420 are electrically connected to contacts 412 of the printed circuit board 410 through bumps 414.

A planarization film 430 is formed on the printed circuit board 410 to cover and/or surround the ASICs 420. The planarization film 430 may be formed of polymer, for example, a SU-8 photoresist, polyimide or the like. The planarization film 430 may have a thickness between about 200 μm and about 500 μm, inclusive.

In the example embodiment shown in FIG. 7, the planarization film includes first and second planarization films 431 and 432. Via-holes 431a are formed through the first planarization film 431 to expose contacts 424 formed on the ASICs 420. First contact plugs 431b fill the via-holes 431a. Connection wires 435 connected to the first contact plugs 431b are formed on the first planarization film 431.

Via-holes 432a are formed through the second planarization film 432 to correspond to pixel electrodes 440. Second contact plugs 432b fill the via-holes 432a. The connection wires 435 connect the second contact plugs 432b with the corresponding first contact plugs 431b. The first contact plugs 431b and the second contact plugs 432b may be formed of aluminum (Al), copper (Cu), an alloy thereof, or the like.

Although not shown in FIG. 7, the horizontal wires 235 (see FIG. 5) illustrated in FIG. 5 may be disposed between the second contact plugs 432b and the pixel electrodes 440.

The plurality of pixel electrodes 440 are formed on the second planarization film 432. In at least the example embodiment shown in FIG. 7, the pixel electrodes 440 are uniformly or substantially uniformly disposed on the planarization film 430. The pixel electrodes 440 are electrically connected to the second contact plugs 432b.

The plurality of pixel electrodes 440 are divided into a plurality of groups, and the pixel electrodes 440 of each group are connected to one of the ASICs 420.

A first diffusion barrier film 450 is formed on the planarization film 430 to cover the pixel electrodes 440. A photoconductor 460, a second diffusion barrier film 470, and a common electrode 480 are sequentially formed on the first diffusion barrier film 450.

The first diffusion barrier film 450 suppresses and/or prevents a reaction between the pixel electrodes 440 and the photoconductor 460. The first diffusion barrier film 450 may be formed of an oxide semiconductor (e.g., a conductive oxide semiconductor). The oxide semiconductor may be a ZnO-based semiconductor including, for example, ZnO and at least one of Ga, In, Hf, Sn, and the like. More particular examples of ZnO-based semiconductors include InZnO, GaInZnO, HfInZnO, SnZnO, and SnInZnO. The first diffusion barrier film 450 may be formed to have a thickness between about 0.1 μm and about 100 μm, inclusive.

The photoconductor 460 may be formed of one material layer. The photoconductor 460 may include one of $HgI_2$, $PbI_2$, CdTe, CdZnTe, PbO, and any mixture thereof.

The second diffusion barrier film 470 is formed on the photoconductor 460. The common electrode 480 may have a flat or substantially flat plate shape and be formed of ITO, copper (Cu), aluminum (Al), an alloy thereof, or the like. If the common electrode 480 is formed of copper (Cu) or aluminum (Al), the second diffusion barrier film 470 may be formed of the same or substantially the same material as that of the first diffusion barrier film 450. The second diffusion barrier film 470 may be formed to have a thickness between about 100 Å and about 1000 Å, inclusive.

In at least this example embodiment, the ASICs 420, the contact plugs 431b and 432b formed in the planarization film 430, and the connection wires 435 connecting the contact plugs 431b and 432b may constitute a signal transmitting unit.

Because the X-ray detector 400 of FIG. 7 uses the first planarization film 431 and the second planarization film 432, the arrangement of the connection wires 435 may be easier relative to the conventional art.

Although the planarization film 430 includes the first and second planarization films 431 and 432 in FIG. 7, example embodiments are not limited thereto. For example, the planarization film 430 may include three or more planarization films. In this example embodiment, contact plugs may be formed through each of the three or more planarization films, and corresponding contact plugs through each planarization film may be connected to each other by connection wires.

Figure 8:
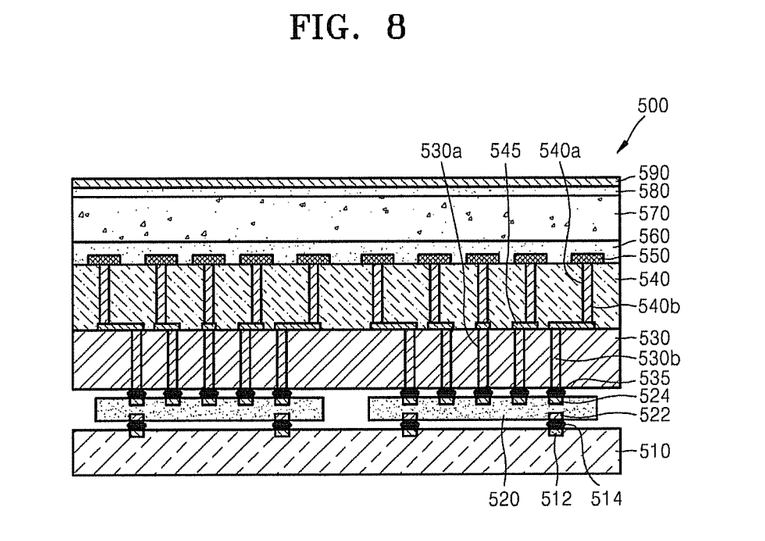
FIG. 8 is a cross-sectional view of an X-ray detector including a diffusion barrier film according to still another example embodiment.

FIG. 8 is a cross-sectional view of an X-ray detector 500 according to another example embodiment.

Referring to FIG. 8, the X-ray detector 500 includes an array of ASICs 520 tiled on a printed circuit board 510. A plurality of contacts 522 are formed on lower portions of the ASICs 520. Contacts 522 of the ASICs 520 are electrically connected to contacts 512 of the printed circuit board 510 by bumps 514.

An insulating layer 530 and a substrate 540 are sequentially stacked on the ASICs 520 and the printed circuit board 510. Via-holes 530a are formed through the insulating layer 530 to correspond to contacts 524 formed on the ASICs 520. First contact plugs 530b fill the via-holes 530a. The first contact plugs 530b are electrically connected to the contacts 524 through bumps 535. Connection wires 545 are formed on the insulating layer 530. The connection wires 545 are connected to the first contact lugs 530b.

The substrate 540 may be formed of silicon, silicon nitride, glass, or the like. Via-holes 540a are formed through the substrate 540 to correspond to pixel electrodes 550. Second contact plugs 540b fill the via-holes 540a. The first contact plugs 530b and the second contact plugs 540b are connected to one another by respective connection wires 545. The first contact plugs 530b and the second contact plugs 540b may be formed of aluminum (Al), copper (Cu), an alloy thereof, or the like.

A plurality of pixel electrodes 550 are formed on the substrate 540. In at least this example embodiment, the pixel electrodes 550 are uniformly or substantially uniformly disposed on the substrate 540. The plurality of pixel electrodes 550 are divided into a plurality of groups. Each group of pixel electrodes 550 is connected to a corresponding ASIC 520.

A first diffusion barrier film 560 is formed on the substrate 540 to cover the pixel electrodes 550. A photoconductor 570, a second diffusion barrier film 580, and a common electrode 590 are sequentially formed on the first diffusion barrier film 560.

The first diffusion barrier film 560 suppresses and/or prevents reaction between the pixel electrodes 550 and the photoconductor 570. The first diffusion barrier film 560 may be formed of an oxide semiconductor (e.g., a conductive oxide semiconductor). The oxide semiconductor may be a ZnO-based semiconductor including, for example, ZnO and at least one of Ga, In, Hf, Sn, and the like. More particular examples of ZnO-based semiconductors include InZnO, GaInZnO, HfInZnO, SnZnO, and SnInZnO. The first diffusion barrier film 560 may be formed to have a thickness between about 0.1 μm and about 100 μm, inclusive.

The photoconductor 570 generates charges according to the strength of incident X-radiation. The photoconductor 570 may be divided into a plurality of seamless pixel regions. The pixel electrodes 550 are formed under the pixel regions, and charges are gathered in the corresponding pixel regions to be converted into electrical signals. The electrical signals are transmitted to the contact 524 of the corresponding ASIC 520.

The second diffusion barrier film 580 may be formed on the photoconductor 570. The common electrode 590 may have a flat or substantially flat plate shape and be formed of ITO, copper (Cu), aluminum (Al), and alloy thereof or the like. If the common electrode 590 is formed of copper (Cu) or aluminum (Al), the second diffusion barrier film 580 may be formed of the same or substantially the same material as that of the first diffusion barrier film 560. The second diffusion barrier film 580 may be formed to have a thickness between about 100 Å and about 1000 Å, inclusive.

In at least this example embodiment, the ASICs 520, the contact plugs 530b and 540b formed through the insulating layer 530 and the substrate 540, and the connection wires 545 connecting the contact plugs 530b and 540b may constitute a signal transmitting unit.

Although not shown in FIG. 8, the second contact plugs 540b may be formed not to contact the pixel electrodes 550, and the connection wires 235 (see FIG. 5) for connecting the second contact plugs 540b and the pixel electrodes 550 may be further formed between the second contact plugs 540b and the pixel electrodes 550.

The X-ray detector 500 of FIG. 8 includes one insulating film between the substrate 540 and the ASICs 520, but example embodiments are not limited thereto. For example, a plurality of insulating layers may be formed between the substrate 540 and the ASICs 520. In this example, contact plugs may be formed through each of the insulating layers to fill in corresponding via-holes, and corresponding contact plugs may be connected each other by connection wires.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. An X-ray detector comprising:
a photoconductor;
a first diffusion barrier film on a first surface of the photoconductor;
at least one pixel electrode on the first diffusion barrier film;
a signal transmitting unit configured to process electrical signals output from the at least one pixel electrode; and
a common electrode on a second surface of the photoconductor, the second surface of the photoconductor being opposite to the first surface of the photoconductor;
wherein
the first diffusion barrier film is a semiconductor that suppresses diffusion of constituents of the photoconductor into the at least one pixel electrode, but conducts both electrons and holes.

2. The X-ray detector of claim 1, wherein the signal transmitting unit comprises:
a transistor and a signal storage capacitor on a substrate;
wherein
an insulating layer is between the at least one pixel electrode and the transistor, and between the at least one pixel electrode and the signal storage capacitor, and
the at least one pixel electrode is connected to a source electrode of the transistor, and connected to an upper electrode of the signal storage capacitor by a contact plug through the insulating layer.

3. The X-ray detector of claim 2, further comprising:
a signal processor connected to a drain electrode of the transistor.

4. The X-ray detector of claim 1, further comprising:
a plurality of pixel electrodes;
wherein the signal transmitting unit includes,
at least one application specific integrated circuit electrically connected to a printed circuit board,
a planarization film on the printed circuit board and covering the at least one application specific integrated circuit, and
contact plugs formed through the planarization film, the contact plugs electrically connecting the plurality of pixel electrodes with contacts of the at least one application specific integrated circuit.

5. The X-ray detector of claim 4, further comprising:
a plurality of connection wires electrically connecting the contact plugs with the plurality of pixel electrodes.

6. The X-ray detector of claim 4, wherein the planarization film comprises:
a plurality of planarization films on the at least one application specific integrated circuit; wherein
the contact plugs are formed through each of the plurality of planarization films.

7. The X-ray detector of claim 6, further comprising:
a plurality of connection wires between adjacent ones of the plurality of planarization films and connecting contact plugs formed through the adjacent planarization films.

8. The X-ray detector of claim 1, further comprising:
a plurality of pixel electrodes;
wherein the signal transmitting unit includes,
at least one application specific integrated circuit electrically connected to a printed circuit board;
at least one insulating layer and a substrate stacked sequentially on the at least one application specific integrated circuit; and
contact plugs formed through the substrate and the insulating layer, the contact plugs connecting the plurality of pixel electrodes with contacts of the at least one application specific integrated circuit.

9. The X-ray detector of claim 8, further comprising:
a plurality of application specific integrated circuits; and
wherein the plurality of pixel electrodes are divided into a plurality of groups, and each group of pixel electrodes corresponds to one of the plurality of application specific integrated circuits.

10. The X-ray detector of claim 8, wherein the at least one insulating layer comprises:
a plurality of insulating layers on the at least one application specific integrated circuit; and
wherein the contact plugs are formed through the plurality of insulating layers.

11. The X-ray detector of claim 10, further comprising:
a plurality of connection wires between adjacent ones of the plurality of insulating layers, the plurality of connection wires connecting the contact plugs formed through the adjacent insulating layers.

12. The X-ray detector of claim 1, wherein the at least one pixel electrode is formed of copper (Cu), aluminum (Al), or an alloy thereof.

13. The X-ray detector of claim 1, wherein the photoconductor includes at least one of mercury(II) iodide ($HgI_2$), lead(II) iodide ($PbI_2$), cadmium telluride (CdTe), cadmium zinc telluride (CdZnTe), and lead(II) oxide (PbO).

14. The X-ray detector of claim 13, wherein the photoconductor is formed of $HgI_2$.

15. The X-ray detector of claim 1, further comprising:
a second diffusion barrier film between the common electrode and the photoconductor.

16. The X-ray detector of claim 15, wherein the second diffusion barrier film is formed of an oxide semiconductor.

17. The X-ray detector of claim 15, wherein the second diffusion barrier film has a thickness between about 100 Å and about 1000 Å, inclusive.

18. The X-ray detector of claim 1, wherein the photoconductor has a thickness between about 100 μm and about 800 μm, inclusive.

19. The X-ray detector of claim 1, wherein the signal transmitting unit comprises:
a transistor and a storage capacitor disposed on a substrate;
wherein
the photoconductor is configured to generate charges in response to incident X-radiation,
the storage capacitor is configured to store the generated charges in response to a voltage applied to the at least one pixel electrode, and
the transistor is configured to transfer the charges to a signal processor.

20. The X-ray detector of claim 1, further comprising:
a signal processor configured to generate an image based on processed electrical signals from the signal transmitting unit.

21. The X-ray detector of claim 1, wherein the first diffusion barrier film has a thickness of about 3000 Å.

22. An X-ray detector comprising:
a photoconductor;
a first diffusion barrier film on a first surface of the photoconductor;
at least one pixel electrode on the first diffusion barrier film;
a signal transmitting unit configured to process electrical signals output from the at least one pixel electrode;
a common electrode on a second surface of the photoconductor, the second surface of the photoconductor being opposite to the first surface of the photoconductor; and
a plurality of pixel electrodes;
wherein the signal transmitting unit includes,
  at least one application specific integrated circuit electrically connected to a printed circuit board,
  at least one insulating layer and a substrate stacked sequentially on the at least one application specific integrated circuit, and
  contact plugs formed through the substrate and the insulating layer, the contact plugs connecting the plurality of pixel electrodes with contacts of the at least one application specific integrated circuit;
wherein the contact plugs include first contact plugs formed through the substrate and second contact plugs formed through the insulating layer; and
wherein the X-ray detector further includes,
  a plurality of connection wires electrically connecting the first contact plugs and the second contact plugs.

23. An X-ray detector of claim 1, comprising: a photoconductor;
a first diffusion barrier film on a first surface of the photoconductor,
the first diffusion barrier film being formed of an oxide semiconductor including zinc;
at least one pixel electrode on the first diffusion barrier film;
a signal transmitting unit configured to process electrical signals output from the at least one pixel electrode; and
a common electrode on a second surface of the photoconductor, the second surface of the photoconductor being opposite to the first surface of the photoconductor.

24. The X-ray detector of claim 23, further comprising:
a second diffusion barrier film between the common electrode and the photoconductor.

25. The X-ray detector of claim 24, wherein the second diffusion barrier film is formed of an oxide semiconductor.

26. The X-ray detector of claim 23, wherein the oxide semiconductor includes zinc-oxide (ZnO) and at least one of gallium (Ga), indium (In), hafnium (Hf), and tin (Sn).

27. The X-ray detector of claim 23, wherein the oxide semiconductor has a resistance between about 1 $\mu\Omega\cdot$cm and about 100 $\Omega\cdot$cm, inclusive.

28. The X-ray detector of claim 23, wherein the first diffusion barrier film has a thickness between about 0.1 $\mu$m and about 100 $\mu$m, inclusive.

29. The X-ray detector of claim 23, wherein the oxide semiconductor further includes at least one of gallium (Ga), indium (In), hafnium (Hf), and tin (Sn).

30. The X-ray detector, of claim 23, wherein the oxide semiconductor is zinc oxide.

31. The X-ray detector of claim 23, wherein the photoconductor includes at least one of mercury(II) iodide ($HgI_2$), lead(II) iodide ($PbI_2$), cadmium telluride (CdTe), cadmium zinc telluride (CdZnTe), and lead(II) oxide (PbO).

32. The X-ray detector of claim 31, wherein the photoconductor is formed of $HgI_2$.

33. An X-ray detector comprising:
a photoconductor;
a first diffusion barrier film on a first surface of the photoconductor;
at least one pixel electrode on the first diffusion barrier film;
a signal transmitting unit configured to process electrical signals output from the at least one pixel electrode;
a common electrode on a second surface of the photoconductor, the second surface of the photoconductor being opposite to the first surface of the photoconductor; and
a second diffusion barrier film between the common electrode and the photoconductor, the second diffusion barrier film being an semiconductor including zinc-oxide (ZnO) and at least one of gallium (Ga), indium (In), hafnium (Hf), and tin (Sn).

34. An X-ray detector comprising:
a photoconductor;
a first diffusion barrier film on a first surface of the photoconductor;
at least one pixel electrode on the first diffusion barrier film;
a signal transmitting unit configured to process electrical signals output from the at least one pixel electrode; and
a common electrode on a second surface of the photoconductor, the second surface of the photoconductor being opposite to the first surface of the photoconductor;
wherein
  the first diffusion barrier film has a resistance greater than about 1 $\mu\Omega\cdot$cm, but less than 100 M$\Omega\cdot$cm.

35. The X-ray detector of claim 32, wherein the first diffusion barrier film conducts both electrons and holes.

36. The X-ray detector of claim 32, wherein the first diffusion barrier film is an oxide semiconductor including zinc.

37. The X-ray detector of claim 32, wherein the photoconductor includes at least one of mercury(II) iodide ($HgI_2$), lead(II) iodide ($PbI_2$), cadmium telluride (CdTe), cadmium zinc telluride (CdZnTe), and lead(II) oxide (PbO).

38. The X-ray detector of claim 37, wherein the photoconductor is formed of $HgI_2$.

* * * * *